United States Patent
Hwang et al.

(10) Patent No.: US 6,794,308 B2
(45) Date of Patent: Sep. 21, 2004

(54) METHOD FOR REDUCING BY-PRODUCT DEPOSITION IN WAFER PROCESSING EQUIPMENT

(75) Inventors: Ming Jang Hwang, Dallas, TX (US); Keizo Hosoda, Plano, TX (US); Shintaro Aoyama, Dallas, TX (US); Tadashi Terasaki, Yatbuo-Machi (JP); Tsuyoshi Tamaru, Ome (JP)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 09/727,547

(22) Filed: Dec. 4, 2000

(65) Prior Publication Data

US 2001/0000146 A1 Apr. 5, 2001

Related U.S. Application Data

(62) Division of application No. 09/354,459, filed on Jul. 15, 1999.
(60) Provisional application No. 60/093,258, filed on Jul. 17, 1998.

(51) Int. Cl.[7] .................... H01L 21/31; H01L 21/469
(52) U.S. Cl. ........................... 438/758; 118/715
(58) Field of Search ...................... 438/758, 485, 438/488, 676, 788, 792; 118/724, 715; 422/168–183

(56) References Cited

U.S. PATENT DOCUMENTS

| | | | |
|---|---|---|---|
| 4,309,241 A | | 1/1982 | Garavaglia et al. ......... 156/613 |
| 4,444,812 A | | 4/1984 | Gutsche ...................... 427/255 |
| 4,513,021 A | | 4/1985 | Purdes et al. ................. 427/38 |
| 4,989,541 A | | 2/1991 | Mikoshiba et al. ......... 118/723 |
| 5,731,592 A | * | 3/1998 | Oh et al. ................ 250/492.21 |
| 5,819,683 A | * | 10/1998 | Ikeda et al. ................. 118/724 |
| 5,879,139 A | * | 3/1999 | Hayashi et al. ............. 417/292 |
| 2001/0008618 A1 | * | 7/2001 | Comita et al. .............. 423/210 |

FOREIGN PATENT DOCUMENTS

| | | | | |
|---|---|---|---|---|
| JP | 6-136220 | | 7/1985 | ......... H01L/21/205 |
| JP | 61-117824 | | 5/1986 | ......... H01L/21/205 |
| JP | 61-117824 | * | 7/1986 | ......... H01L/21/205 |
| JP | 63-199412 | | 8/1988 | ......... H01L/21/205 |
| JP | 2-255594 | | 10/1990 | ......... H01L/21/205 |
| JP | 11-240794 | | 9/1999 | ......... H01L/21/205 |

* cited by examiner

Primary Examiner—Erik J. Kielin
(74) Attorney, Agent, or Firm—Wade James Brady, III; Frederick J. Telecky, Jr.

(57) ABSTRACT

A method of reducing by-product deposition inside wafer processing equipment includes providing a chamber having a peripheral inner wall and placing a semiconductor wafer within the chamber. The method also includes placing a ring within the chamber proximate the peripheral inner wall and introducing a plurality of reactant gases into the chamber and reacting the gases. The method also includes introducing a heated gas into the chamber through the ring proximate the peripheral inner wall to increase the temperature of the peripheral inner wall.

6 Claims, 4 Drawing Sheets

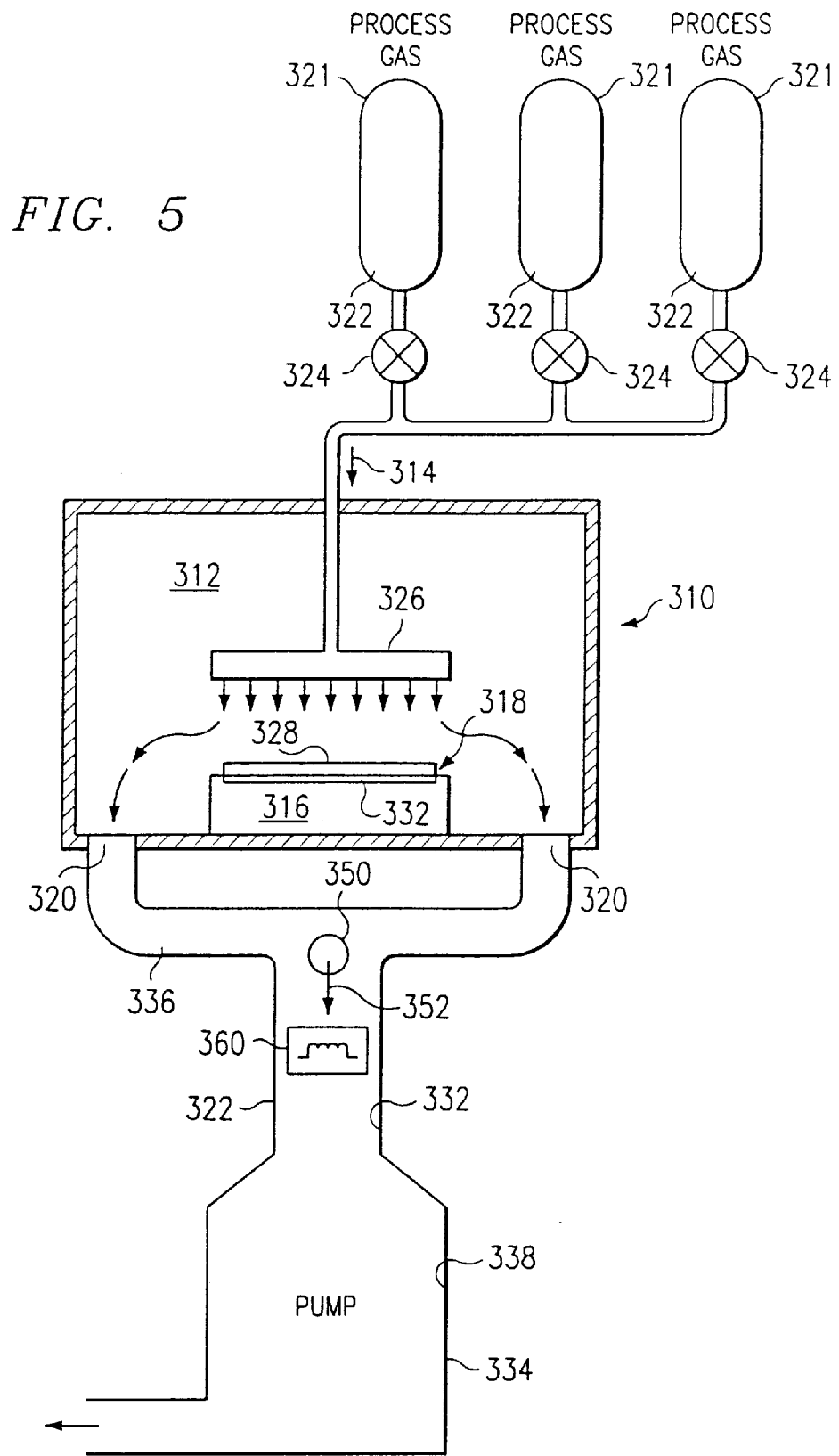

METHOD FOR REDUCING BY-PRODUCT DEPOSITION IN WAFER PROCESSING EQUIPMENT

CROSS REFERENCE TO PRIOR APPLICATIONS

This application is a division of Ser. No. 09/354,459, filed Jul. 15, 1999, which claims Benefit of Provisional Application No. 60/093,258 under 35 U.S.C. 119(e), filed Jul. 17, 1998.

CROSS REFERENCE TO RELATED APPLICATIONS

This application is related to a co-pending application entitled Method to Reduce By-Product Deposition in Wafer Processing Equipment and Improved Apparatus, filed Jan. 7, 1998, having a serial No. of 60/070,697.

TECHNICAL FIELD OF THE INVENTION

This invention relates generally to semiconductor manufacturing and more particularly to a method and system for reducing by-product deposition in wafer processing equipment.

BACKGROUND OF THE INVENTION

During the manufacture of semiconductor components, such as integrated circuits, memory chips, and the like, the failure of valves and pumps used in connection with wafer processing equipment is problematic. The failure is often caused by the deposition of by-products, such as by deposition of ammonia chloride ($NH_4Cl$). In certain chemical vapor deposition ("CVD") processes such as chloride-based ammonia reduction CVD processes, ammonia chloride (NH4Cl) is formed by reacting, for example, hydrogen chloride (HCL) with ammonia ($NH_3$). The resulting ammonia chloride may sublimate to a solid and stick to the inside of a wafer processing chamber wall or on the inside of associated valves and pumps. The build up over time of solidified ammonium chloride inside the valves and pumps may cause the valves to leak and the pumps to degrade, and the solidified ammonium chloride may also be transmitted into the process chambers, contaminating the manufacturing processes and reducing their yield.

One attempt at solving such a problem involves placing heaters around the wafer processing chamber or associated pump or conduits to maintain the produced ammonia chloride in a gaseous form to prevent sublimation to a solid form. However, in single wafer processing reactors for chemical vapor deposition of silicon nitride ($SiCl_2H_2$ and $NH_3$ reaction) and titanium nitride ($TiCl_4$ and $NH_3$ reaction), process gases from a shower head flow into and through a chamber with high velocity and low temperatures. This flow removes a large amount of heat from inner walls of the reaction system. Because of the removal of heat from the inner walls, heating the outer walls may not be sufficient to prevent sublimation of ammonia chloride to a solid form.

SUMMARY OF THE INVENTION

Accordingly, a need has arisen for an improved method and system for reducing ammonium chloride deposition in wafer processing equipment. The present invention provides a method and system for reducing ammonium chloride deposition in single wafer processing equipment that addresses shortcomings of prior systems and methods.

According to one embodiment of the invention, a method of reducing by-product deposition inside wafer processing equipment includes providing a chamber having a peripheral inner wall and placing a semiconductor wafer within the chamber. The method also includes placing a ring within the chamber proximate the peripheral inner wall and introducing a plurality of reactant gases into the chamber and reacting the gases. The method also includes introducing a heated gas into the chamber through the ring proximate the peripheral inner wall to increase the temperature of the peripheral inner wall.

According to another embodiment of the invention, a method of reducing by-product deposition inside wafer processing equipment includes providing a chamber and placing a semiconductor wafer within the chamber. The method also includes connecting the chamber to a pump through a conduit and placing a heating element within the interior of the conduit to increase a temperature within the conduit. The method also includes introducing a plurality of reactant gases into the chamber and reacting the gases.

Embodiments of the invention provide numerous technical advantages. For example, in one embodiment of the invention, introduction of a heated gas through a ring along the periphery of the inner wall of a chamber inhibits solidification of by-products in water processing, such as ammonia chloride. Such inhibiting reduces degeneration of associated valves and pumps. In addition, the amount of solidified by-product contaminating the manufacturing process is reduced, which increases the yield of the manufacturing process.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIG. 5 is a schematic cross sectional diagram of a portion of a conduit according to the teachings of the present invention.

DETAILED DESCRIPTION OF THE INVENTION

Embodiments of the present invention and its advantages are best understood by referring to FIGS. 1 through 5 of the drawings, like numerals being used for like and corresponding parts of the various drawings.

Figure 1:
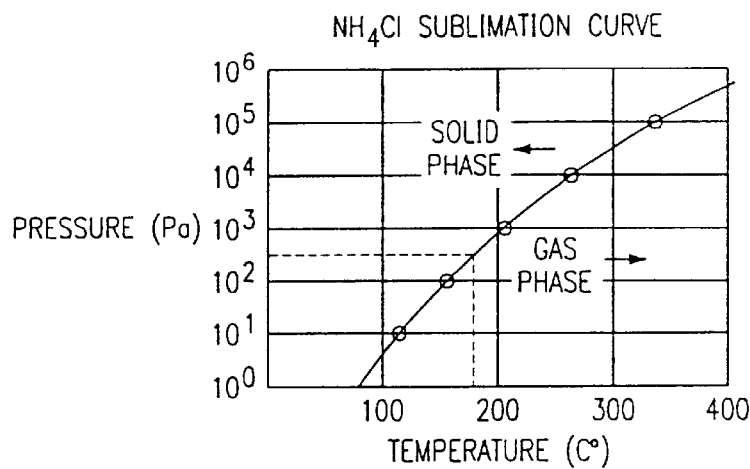
FIG. 1 is a graph illustrating a sublimation curve for ammonia chloride.

FIG. 1 is a graph illustrating a sublimation curve for an example semiconductor processing by-product, ammonia chloride ($NH_4Cl$). The illustrated graph indicates the temperature and pressure conditions at which ammonia chloride changes from a solid into a gas. For example, at 300 Pascals, which is an example pressure at which film formation occurs, ammonia chloride is a gas at temperatures above approximately 180° C. and is a solid at temperatures below approximately 180° C. This curve demonstrates the combination of pressure and temperatures at which ammonia chloride will take a gaseous or solid form, and therefore may be used to ascertain pressures and temperatures at which it is necessary to keep produced ammonia chloride to avoid solidification within a wafer processing system. Although a sublimation curve for ammonia chloride is presented, similar curves exist for other chemicals used in chemical vapor deposition processes.

Figure 2A:
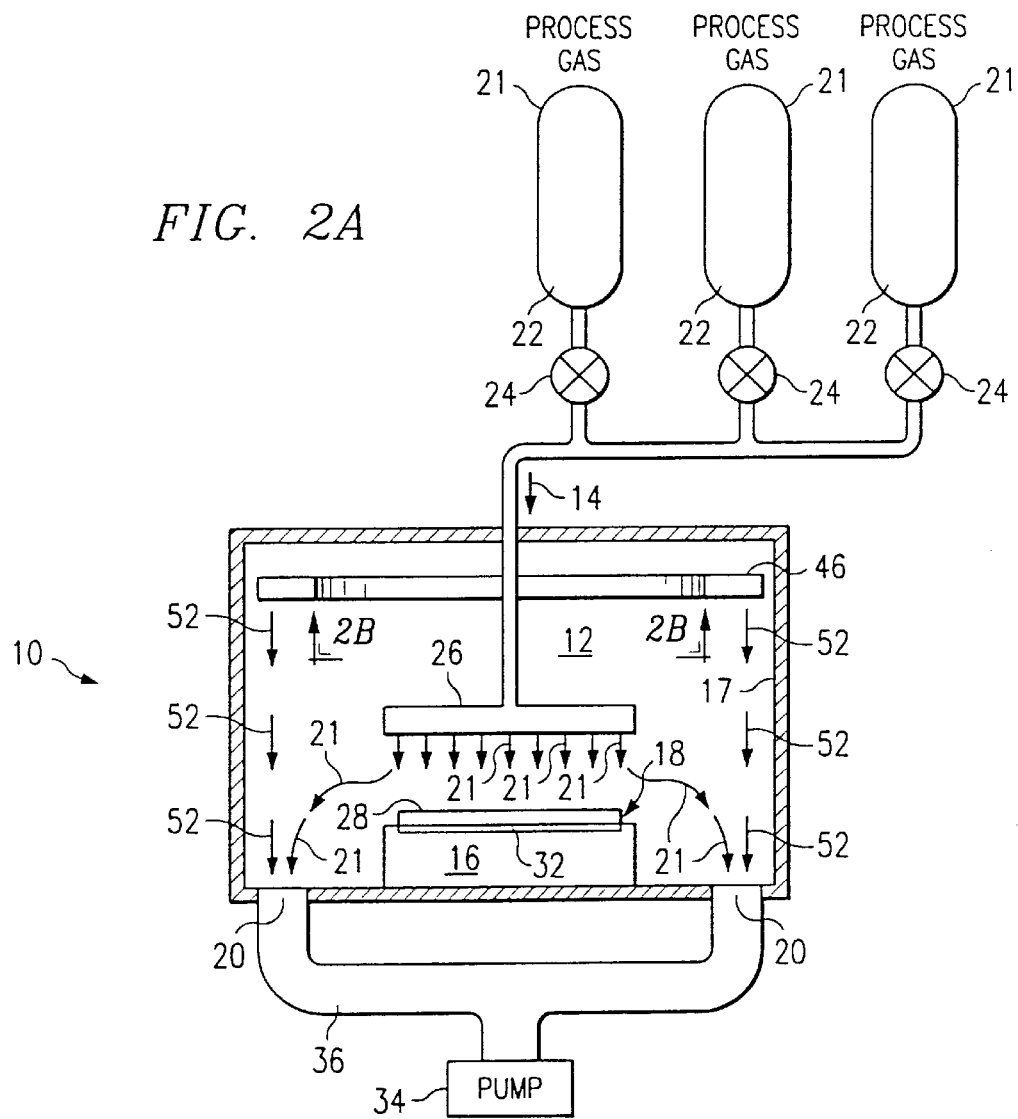
FIG. 2A is a schematic block diagram illustrating a chemical vapor deposition reactor and associated equipment for wafer processing according to the teachings of the present invention.

FIG. 2A is a schematic diagram illustrating a chemical vapor deposition reactor 10 for use in accordance with one embodiment of the present invention. Reactor 10 includes a hermetically sealed chamber 12, an inlet port 14 for introducing reactants into chamber 12, a semiconductor support 16 for holding a substrate 18 in chamber 12, and an outlet port 20 for evacuating chamber 12. In this embodiment, reactor 10 is a single wafer processing reactor, which processes one wafer at a time. Chamber 12 has an inner peripheral wall 17. Inlet port 14 is connected to a plurality of reactant gas stores 21 storing reactant gases 22. Each gas store 21 includes a metering device 24 to control the introduction of reactant gases 22 into chamber 12. Reactant gases 22 may be otherwise provided to chamber 12 without departing from the teachings of the present invention.

Inlet port 14 is connected to a "shower head" manifold 26 in chamber 12 for dispersing reactant gases 22 across a surface 28 of substrate 18. Manifold 26 may be connected to a radio frequency source (not explicitly shown) for generating plasma to transfer energy to reactant gases 22 in chamber 12.

Semiconductor support 16 may include clips or other suitable means for securing substrate 18 over manifold 26. Substrate 18 may be a wafer, silicon slice, or any other work piece onto which thin films are deposited. A suceptor, or heater 32, may be included as part of support 16 to transfer thermal energy to reactant gases at surface 28 of substrate 18. Semiconductor support 16 may be formed from graphite. Heater 32 may be a radio frequency, resistive, or other suitable heater.

Outlet port 20 is connected to a vacuum pump 34 through a conduit 36. Vacuum pump 34 evacuates and maintains chamber 12 at a desired pressure. An example of a desired pressure is in the range of 0.4 to approximately 8 torr; however, other suitable pressures may be maintained.

In chlorine-based ammonia reduction chemical vapor deposition, for example, reactant gases 22 may include silicon nitride utilizing dichlorosilane ($SiCl_2H_2$), ammonia, titanium nitride (TiN), and titanium tetrachloride ($TiCl_4$). Reaction of ammonia with hydrogen chloride (HCl) produced from the above reactants forms ammonia chloride ($NH_4Cl$). Because of standard operating temperatures and pressures for reactor 10, this formed ammonia chloride has a tendency to sublimate from gaseous form to a solid form and stick to the walls of chamber 12, conduit 36, pump 34, and associated valves (not explicitly shown). This sublimation problem is particularly acute in single wafer processing systems utilizing shower head manifold 26, because reactant gases 22 typically flow through shower head manifold 26 at low temperatures and high velocities, resulting in large heat losses within chamber 12 and along inner peripheral wall 17. To combat the sublimation of formed ammonia chloride to a solid form and deposition of solid ammonia chloride within reactor 10, pump 34, conduit 36, and other elements associated with reactor 10, but particularly along inner peripheral wall 17 of reactor 10, a ring 46 is provided within chamber 12. Ring 46 introduces hot gases 52 along the periphery of inner peripheral wall 17 of chamber 12 to keep the temperature along inner wall 17 at a temperature sufficient to inhibit the produced ammonia chloride from sublimating to a solid form. The introduction of hot gases 52 within chamber 12, and particularly along inner peripheral wall 17, provides efficient convective heating that is more effective than heating the exterior of chamber 12.

Figure 2B:
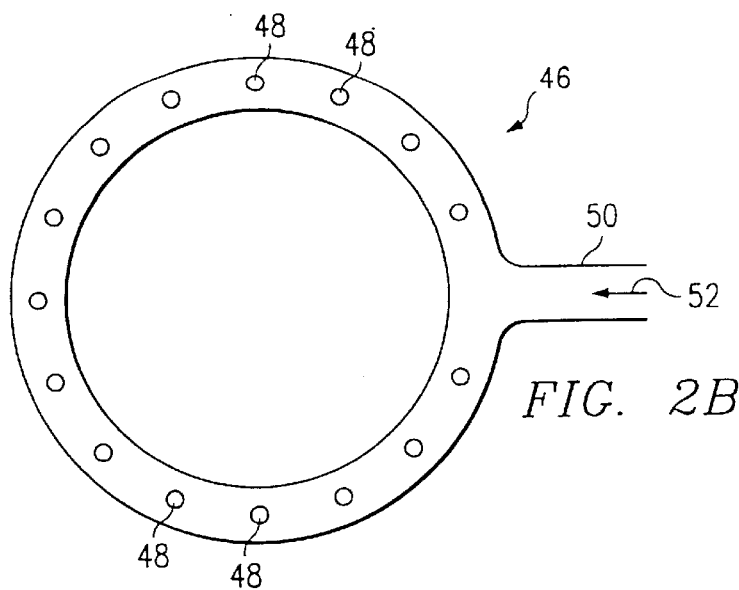
FIG. 2B is a schematic cross sectional drawing of a ring for use in the reactor of FIG. 2A.

FIG. 2B illustrates a cross sectional view of ring 46 along the line 2B—2B of FIG. 2A. As illustrated, ring 46 is generally circular and includes a plurality of apertures 48 for providing a hot gas into chamber 12 to heat inner wall 17 of chamber 12; however, ring 46 may take on any suitable configuration, particularly including configurations that conform to the shape of inner peripheral wall 17. A hot gas conduit 50 provides a path for hot gases 52 to flow into ring 46. Hot gases 52 may include any suitable gas for introduction into chamber 12, including hot purge gases that may be available from other steps of the semiconductor wafer processing process. Particularly suitable gases include hydrogen and nitrogen, because these gases will not interact with reactant gases 22. Although purge gases may be particularly useful, other gas sources may be utilized without departing from the teachings of the present invention. Thus, the introduction of hot gases along inner peripheral wall 17 increases the temperature of peripheral wall 17 to an extent that would otherwise be difficult using conventional techniques and overcomes heat loss associated with reactant gases 22 flowing through shower head manifold 26 at low temperatures and high velocity. Such increase in temperature inhibits sublimation of produced by-products, such as ammonia chloride, and therefore reduces degradation of associated valves and pumps in addition to reducing contamination of the manufacturing process.

Figure 3:
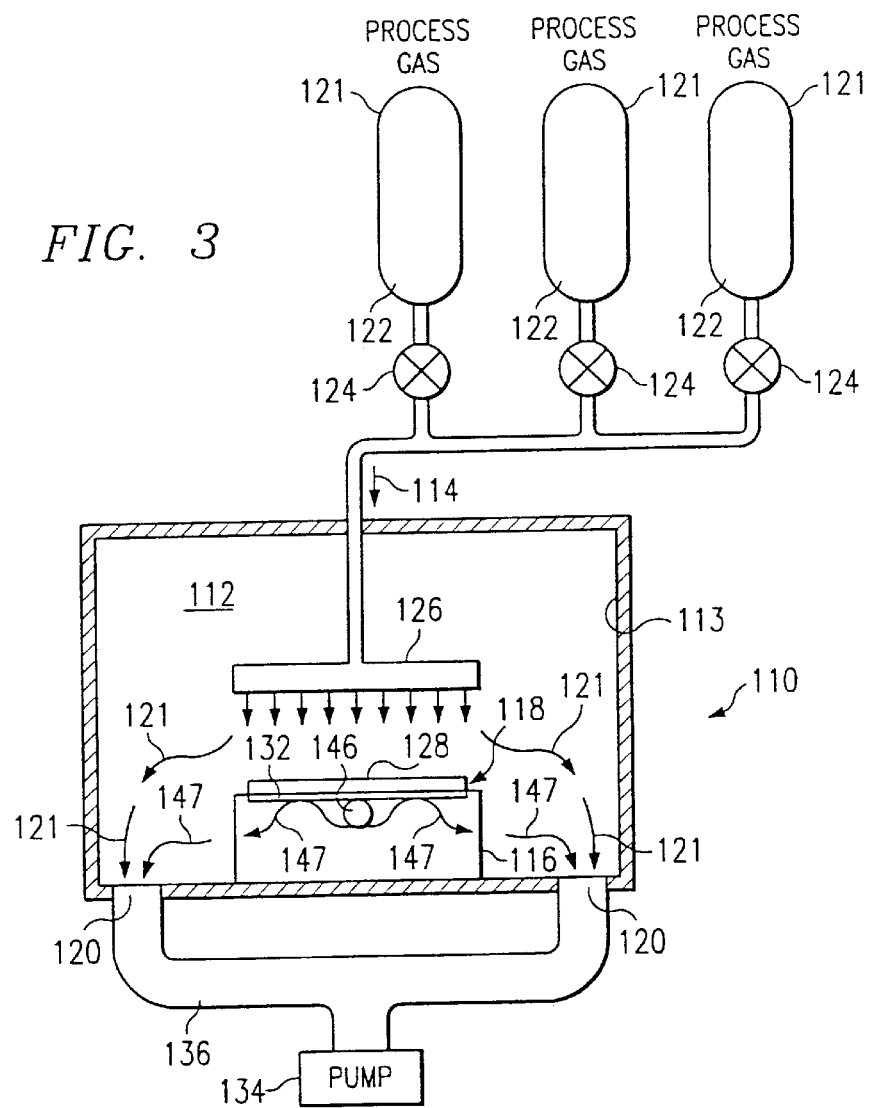
FIG. 3 is a schematic cross sectional drawing of another embodiment of a wafer processing reactor according to the teachings of the present invention.

FIG. 3 illustrates a cross sectional schematic of another embodiment of the present invention. A reactor system 110 is analogous to reactor system 10; however, instead of utilizing ring 46 to provide hot gases 152 to the interior of a chamber 112, hot gases 152 are provided directly through a conduit 146 to the underside of a semiconductor support 116, which in this example is heater 32. The provided hot gases 152 flare outward towards an inner wall 117 near connection of chamber 112 to an outlet port 120.

The provision of hot gases 152 underneath semiconductor support 116 is particularly useful in heating a conduit 136 and preventing sublimation of by-products, such as ammonia chloride, to a solid form within a conduit 136 in addition to preventing sublimation of ammonia chloride to a solid form within chamber 112. Hot gases 152 may include any suitable gas for introduction into chamber 112, including hot purge gases that may be available from other steps of the semiconductor wafer processing process. Particularly suitable gases include hydrogen and nitrogen, because these gases will not interact with reactant gases 122. This introduction of hot gases 152 may be combined with the introduction of hot gases 52, as illustrated in FIG. 2A.

Figure 4:
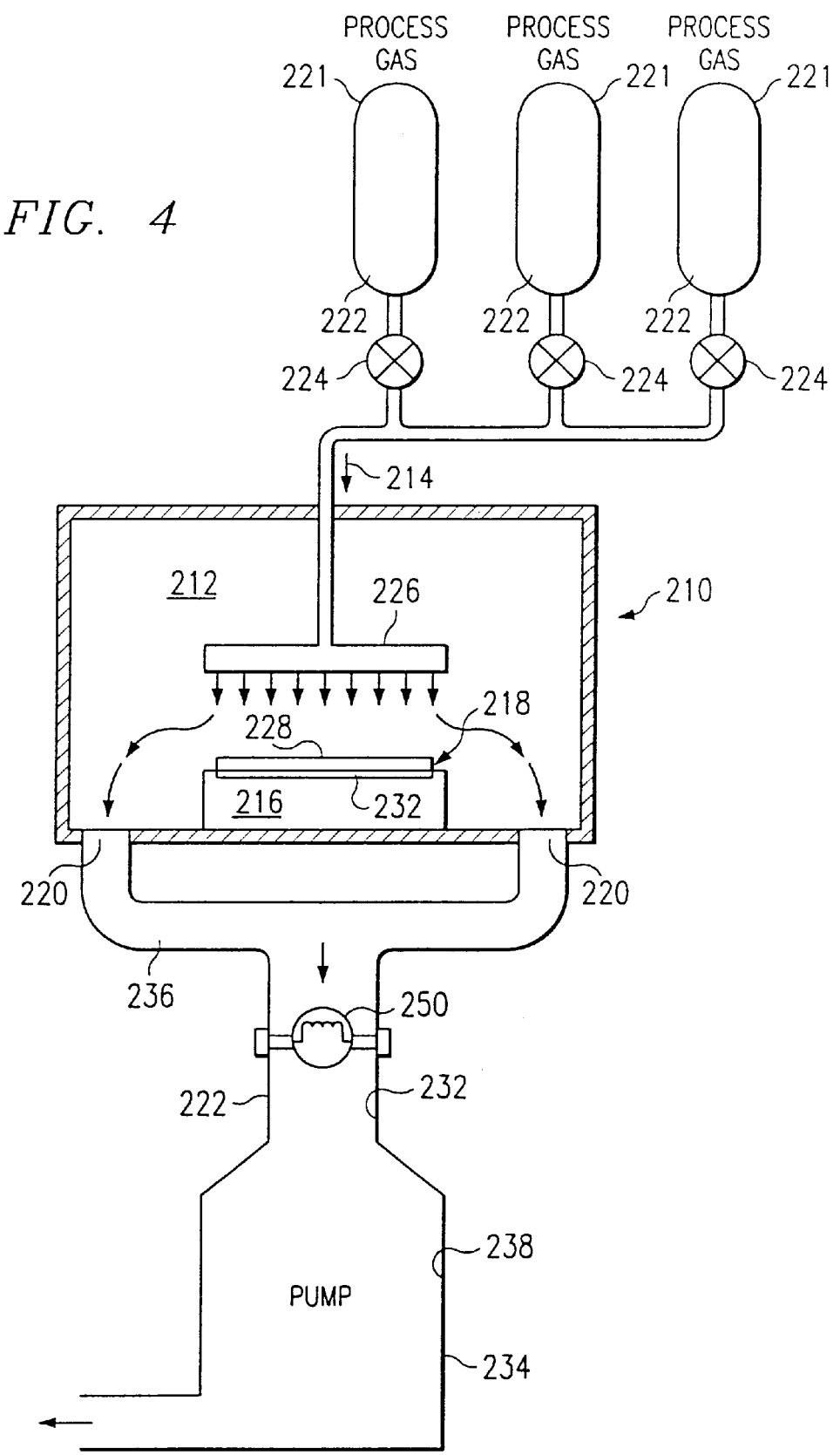
FIG. 4 is a schematic cross sectional drawing of a pump and a conduit associated with a wafer processing reactor according to the teachings of the present invention.

FIG. 4 illustrates another embodiment of the present invention. Illustrated in FIG. 4 is a reactor 210 analogous to reactor 10, illustrated in FIG. 1. Attached to reactor 210 is a conduit 236 leading to a pump 234. Conduit 236 receives gases from a reactor such as reactor 210 through application of negative pressure by pump 234. Disposed within conduit 236 is a heating element 250. Heating element 250 increases the temperature within conduit 236 and pump 234. In particular, heating element 250 increases the temperature of an inner wall 232 of conduit 236 and an inner wall 238 of pump 234. Increasing the temperature of inner walls 232 and 238 of conduit 236 and pump 234, respectively, inhibits solidification of, for example, ammonia chloride on inner walls 232 of conduit 236 and 238 of pump 234. Heating element 250 may be any suitable heater for increasing the temperature within conduit 236 or pump 234; however, according to one embodiment of the invention, heating element 250 is a tungsten halogen lamp.

The introduction of a heating element within the interior of conduit 236 allows more effective heating than heating the exterior of conduit 236. This more effective heating prevents sublimation of by-product gases to a solid form and therefore reduces degradation of associated valves and pumps in addition to reducing contamination of the manufacturing process. The introduction of a heating element into conduit 236 may be combined with the techniques described in conjunction with FIGS. 2A, 2B, and 3 to further prevent sublimation of by-product gas.

FIG. 5 illustrates a schematic cross sectional diagram of a portion of a conduit 336 suitable for use with the present invention. According to the embodiment illustrated in FIG. 5, conduit 336 receives hot hydrogen 352 through a conduit 350 from a hot hydrogen source (not explicitly shown). In addition to heating an inner wall 332 of conduit 336 and an inner wall 338 of a pump 334, hot hydrogen gas 352 provides a hydrogen passivation for, for example, ammonia chloride. Hydrogen passivation of ammonia chloride inhibits formation of ammonia chloride from its constituent elements. Therefore, in addition to preventing the solidification of by-products such as ammonia chloride, use of hot hydrogen 352 prevents the formation of both gas and solid ammonia chloride. To further inhibit the formation of by-products such as ammonia chloride by hydrogen passivation, a platinum catalyst 360 and a heater 354 may be disposed within conduit 332 to generate free hydrogen radicals. In addition, heater 354 may also be added to facilitate generation of free hydrogen radicals. The existence of free hydrogen radicals more efficiently inhibits the formation of ammonia chloride and therefore inhibits formation of solid ammonia chloride on inner walls 332 and 338.

Although the present invention and its advantages have been described in detail, it should be understood the various changes, substitutions, and alterations can be made therein without departing from the spirit and scope of the present invention as defined by the appended claims.

What is claimed is:

1. A method of reducing by-product deposition inside wafer processing equipment, comprising the steps of:

providing a chamber and a pump for exhausting gases from said chamber;

placing a semiconductor wafer within the chamber;

connecting the chamber to said pump through a conduit, said conduit having an interior wall;

placing a heating element within the interior of the conduit to increase the temperature of said interior wall within the conduit sufficiently to maintain by-product gases passing therethrough from said chamber in the gaseous state;

introducing a plurality of reactant gases into the chamber and reacting the reactant gases to form said by-product gases of the reaction of said reactant gases; and causing said by-product gases to travel from said chamber to said pump through said conduit having heated interior walls sufficient to maintain said by-product gases in the gaseous state to minimize solidification of said by-products on the walls of said conduit and said pump.

2. The method of claim 1, wherein placing a heating element within the interior of the conduit comprises placing a tungsten halogen lamp within the conduit.

3. The method of claim 1, wherein providing a chamber comprises providing a single wafer chamber.

4. The method of claim 1, wherein providing a chamber comprises providing a chamber suitable for processing multiple semiconductor wafers concurrently.

5. The method of claim 1, further comprising the step of introducing a heated gas into the chamber to increase the temperature of the interior walls of the chamber.

6. The method of claim 1, further comprising the step of introducing a heated gas into the conduit to further increase the temperature of the interior walls of the conduit.

* * * * *